(12) United States Patent
Yata et al.

(10) Patent No.: US 10,788,720 B2
(45) Date of Patent: Sep. 29, 2020

(54) DISPLAY DEVICE

(71) Applicant: Japan Display Inc., Minato-ku (JP)

(72) Inventors: Tatsuya Yata, Tokyo (JP); Takayuki Nakanishi, Tokyo (JP); Takeo Koito, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/975,920

(22) Filed: May 10, 2018

(65) Prior Publication Data

US 2018/0329262 A1 Nov. 15, 2018

(30) Foreign Application Priority Data

May 11, 2017 (JP) ................................. 2017-094693

(51) Int. Cl.
*G02F 1/1343* (2006.01)
*G02F 1/1368* (2006.01)
(Continued)

(52) U.S. Cl.
CPC ........ *G02F 1/134309* (2013.01); *G02F 1/137* (2013.01); *G02F 1/1337* (2013.01); *G02F 1/1339* (2013.01); *G02F 1/1347* (2013.01); *G02F 1/1368* (2013.01); *G02F 1/133512* (2013.01); *G02F 1/133514* (2013.01); *G02F 1/133528* (2013.01); *G02F 1/136286* (2013.01); *G02F 1/29* (2013.01); *H01L 27/124* (2013.01);
(Continued)

(58) Field of Classification Search
CPC ......... G02F 1/134309; G02F 1/133512; G02F 1/133514; G02F 1/133528; G02F 1/1337; G02F 1/1339; G02F 1/136286; G02F 1/1368; G02F 1/137; G02F 2001/13706; G02F 2201/121; G02F 2201/123; H01L 27/1214; H01L 27/124
See application file for complete search history.

(56) References Cited

U.S. PATENT DOCUMENTS

2005/0243237 A1 11/2005 Sasuga
2006/0038944 A1* 2/2006 Kim .................. G02F 1/133553
349/114

(Continued)

FOREIGN PATENT DOCUMENTS

JP 2005-317879 11/2005
JP 2006-516753 7/2006
(Continued)

*Primary Examiner* — Nathanael R Briggs
(74) *Attorney, Agent, or Firm* — Oblon, McClelland, Maier & Neustadt, L.L.P.

(57) ABSTRACT

According to one embodiment, a display device includes a display panel including a reflective layer, a liquid crystal element opposing the display panel and a controller that controls the liquid crystal element. The liquid crystal element includes a first substrate, a second substrate, a liquid crystal layer, a first control electrode, a second control electrode, a third control electrode, and a fourth control electrode. The controller applies a first voltage for forming a first lens of a first shape, to the first control electrode and the second control electrode, and a second voltage for forming a second lens of a second shape, to the third control electrode and the fourth control electrode. The first shape is different from the second shape.

11 Claims, 17 Drawing Sheets

(51) Int. Cl.
*G02F 1/1362* (2006.01)
*G02F 1/1335* (2006.01)
*G02F 1/1337* (2006.01)
*H01L 27/12* (2006.01)
*G02F 1/1339* (2006.01)
*G02F 1/137* (2006.01)
*G02F 1/29* (2006.01)
*G02F 1/1347* (2006.01)

(52) U.S. Cl.
CPC .................. *H01L 27/1214* (2013.01); *G02F 2001/13706* (2013.01); *G02F 2001/134381* (2013.01); *G02F 2201/121* (2013.01); *G02F 2201/123* (2013.01); *G02F 2203/24* (2013.01); *G02F 2203/28* (2013.01)

(56) References Cited

U.S. PATENT DOCUMENTS

| | | |
|---|---|---|
| 2006/0098296 A1 | 5/2006 | Woodgate et al. |
| 2006/0152812 A1* | 7/2006 | Woodgate ............... G02B 3/005 359/619 |
| 2006/0164593 A1 | 7/2006 | Peyghambarian et al. |
| 2010/0208152 A1* | 8/2010 | Kim ......................... G02B 3/14 349/15 |
| 2016/0054573 A1* | 2/2016 | Kasano ............... G02B 27/2214 349/33 |
| 2018/0192038 A1* | 7/2018 | Smith ....................... G02F 1/29 |

FOREIGN PATENT DOCUMENTS

| | | |
|---|---|---|
| JP | 2007-264321 | 10/2007 |
| JP | 2007-535686 | 12/2007 |
| JP | 2008-529064 | 7/2008 |

* cited by examiner

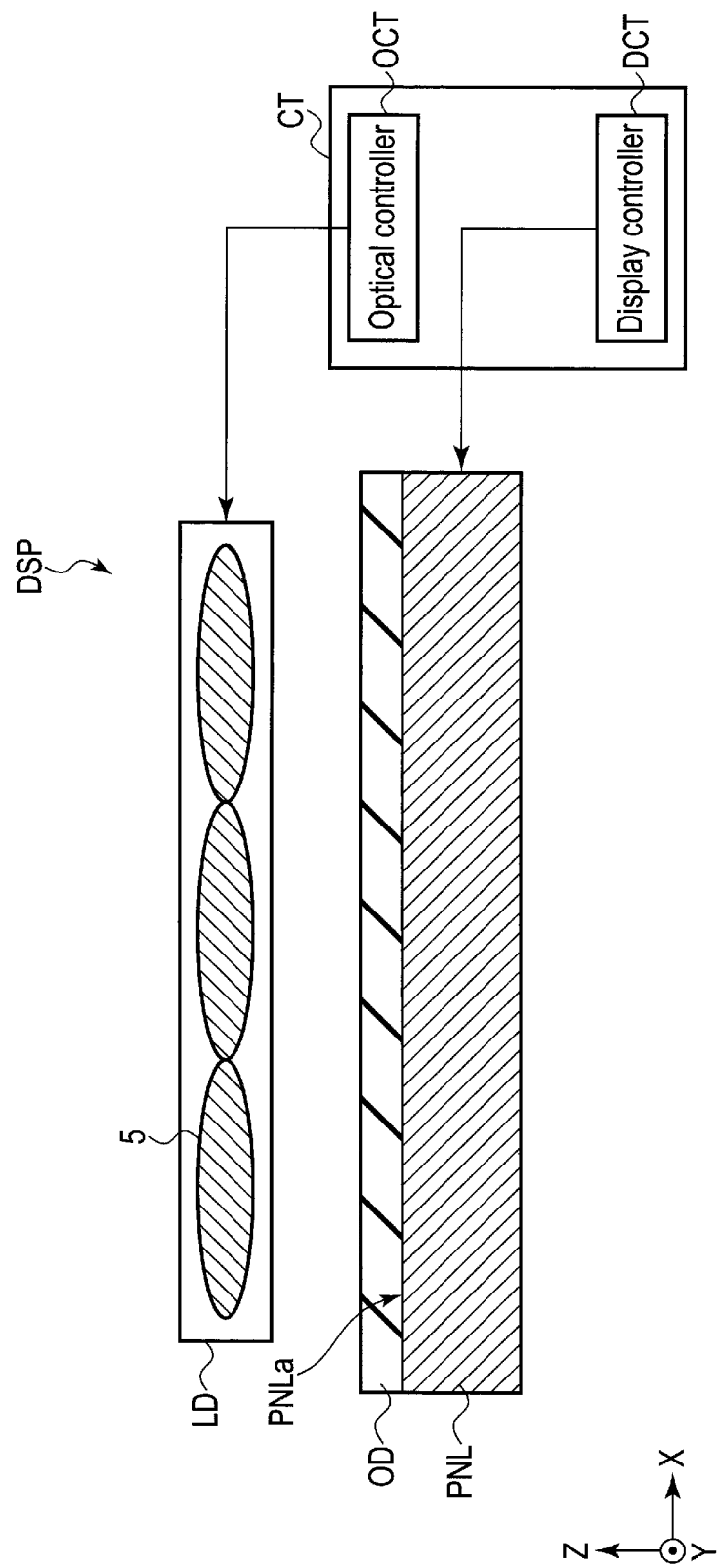
F I G. 1

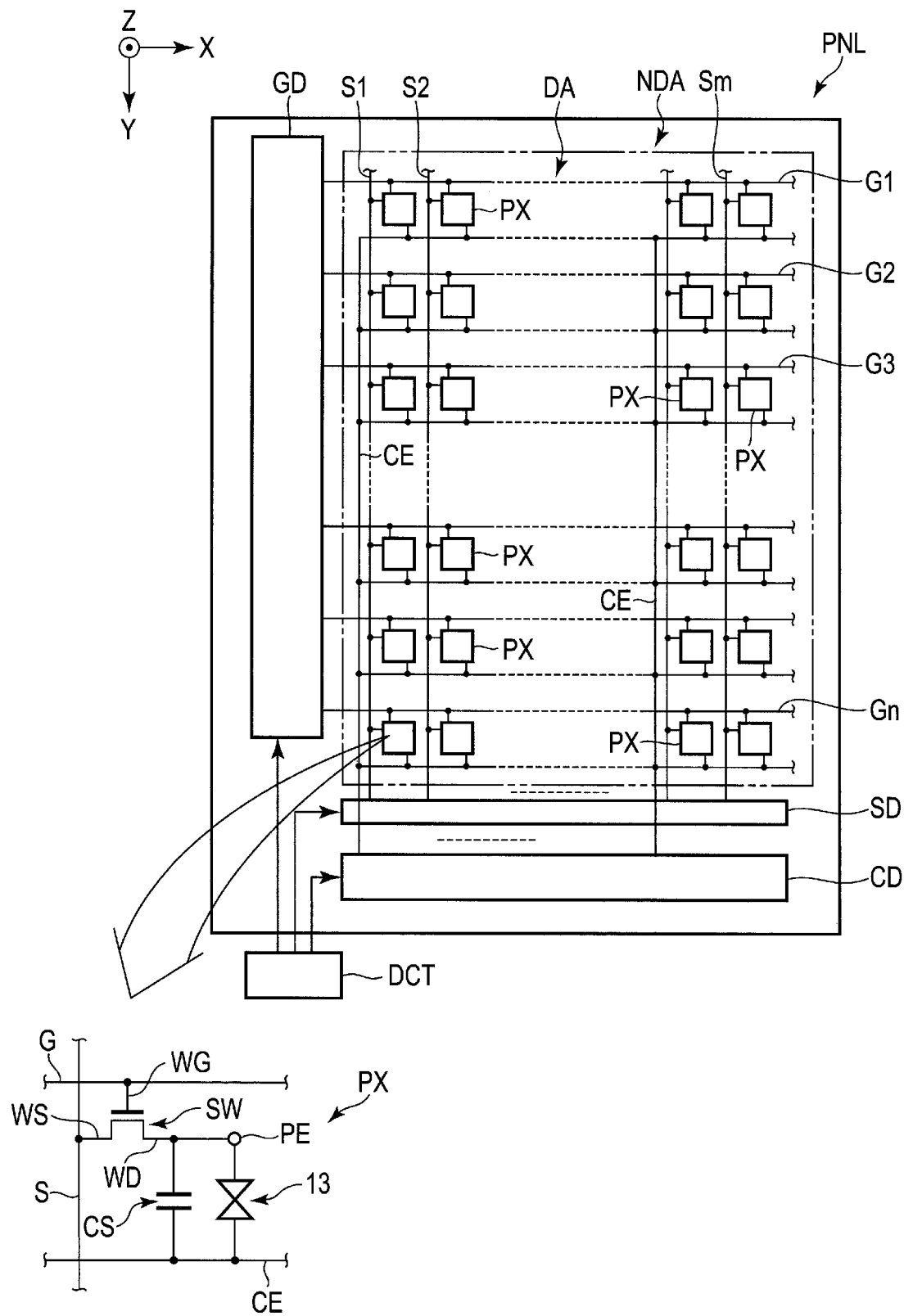
F I G. 2

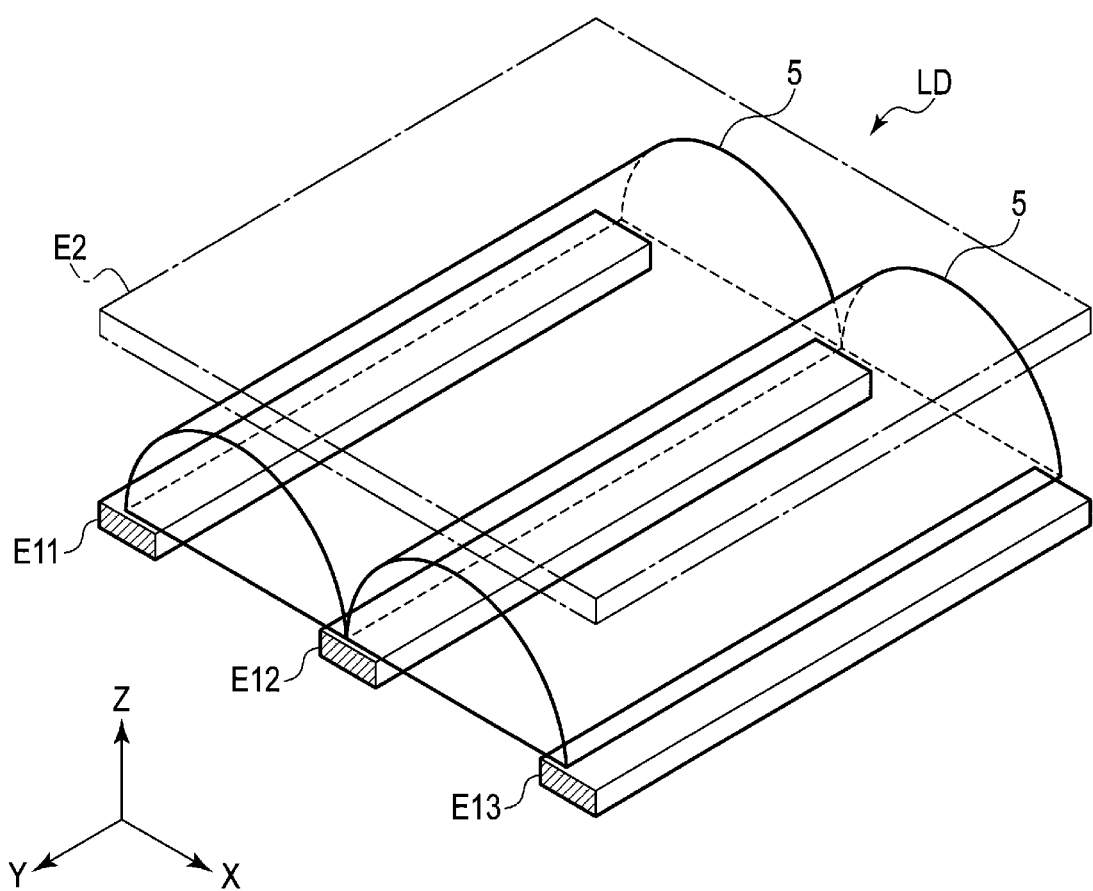
F I G. 8

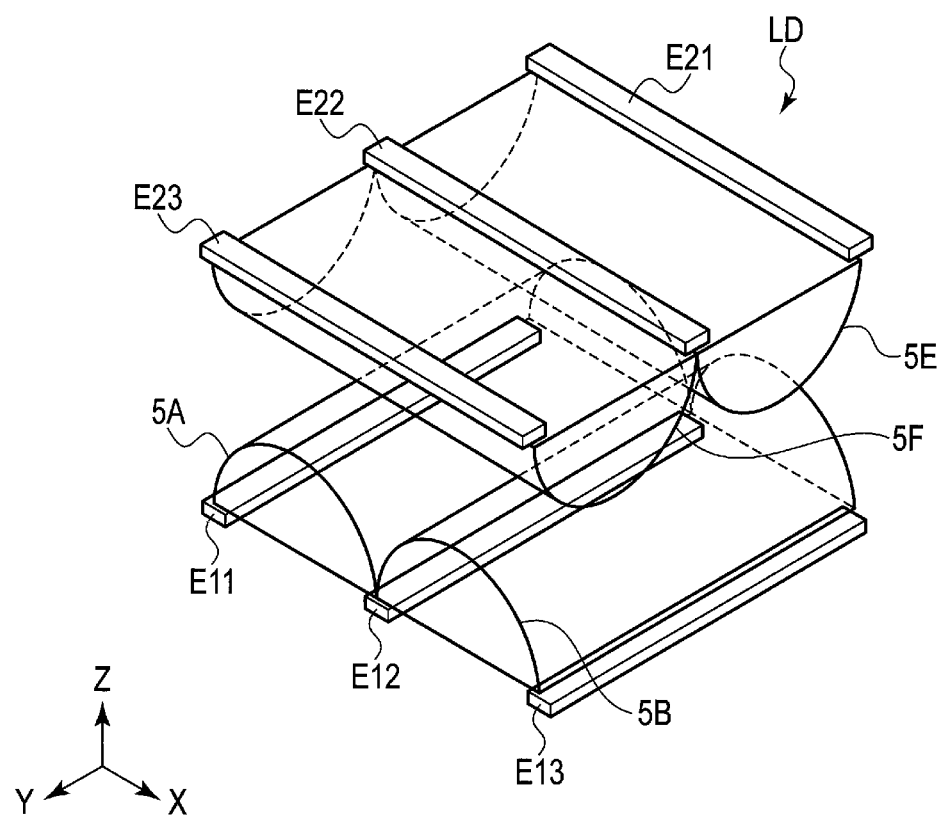
F I G. 9

| Gradation value | Reflectivity (amount of light entering of 100%) | Reflectivity (amount of light entering of 50%) | Reflectivity (amount of light entering of 25%) |
|---|---|---|---|
| 0 | 0% | 0% | 0% |
| 1 | 33.3% | 16.6% | 8.3% |
| 2 | 66.6% | 33.3% | 16.6% |
| 3 | 100% | 50% | 25% |

F I G. 16

DISPLAY DEVICE

CROSS-REFERENCE TO RELATED APPLICATIONS

This application is based upon and claims the benefit of priority from Japanese Patent Application No. 2017-094693, filed May 11, 2017, the entire contents of which are incorporated herein by reference.

FIELD

Embodiments described herein relate generally to a display device.

BACKGROUND

For example, an image display device comprising a diffusion-control liquid crystal panel and a liquid crystal display panel has been proposed. The diffusion-control liquid crystal panel can switch a lens-forming state in which linearly polarized light oscillating in a predetermined direction, of light having directivity in a specific direction, is diffused, and a non-lens-forming state in which light is transmitted while maintaining the directivity of the light. In the lens-forming state, a plurality of liquid crystal microlens portions are formed as voltage being applied to the liquid crystal layer.

Apart from above, various techniques are known, which form lenses in a liquid crystal layer.

BRIEF DESCRIPTION OF THE DRAWINGS

FIG. 1 is a diagram showing a configuration example of a display device of this embodiment.

FIG. 2 is a diagram showing a basic configuration and an equivalent circuit, of a display panel shown in FIG. 1.

FIG. 8 is a diagram showing an example of the shape of the lens.

FIG. 9 is a diagram showing another example of the shape of the lens.

FIG. 16 is a diagram showing a table summarizing examples of reflectivities expressible by the display device of the embodiment.

DETAILED DESCRIPTION

Figure 3:
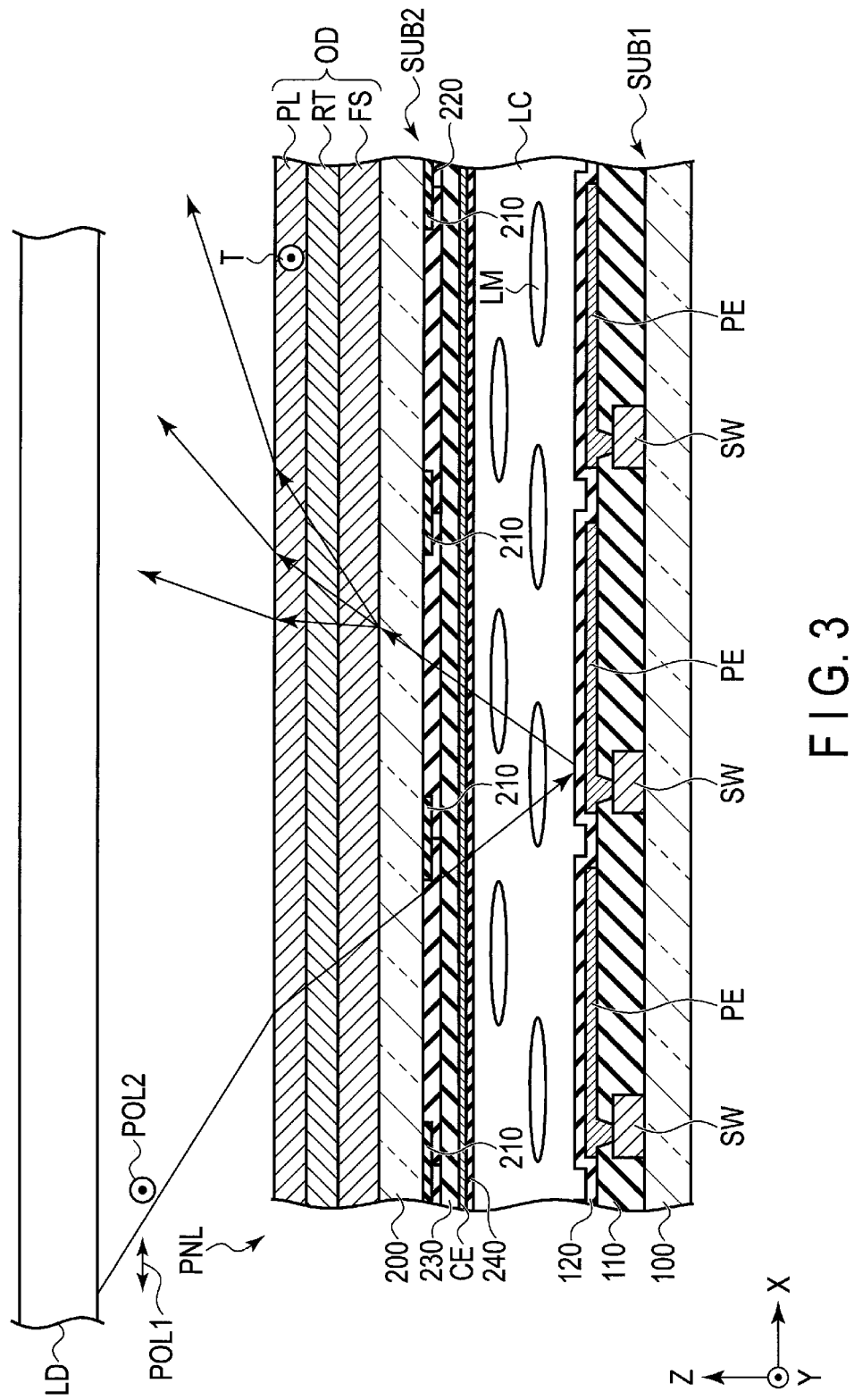
FIG. 3 is a cross section showing a configuration example of the display panel shown in FIG. 2.

In general, according to one embodiment, a display device comprising: a display panel comprising a reflective layer; a liquid crystal element opposing the display panel; and a controller that controls the liquid crystal element, the liquid crystal element comprising a first substrate, a second substrate, a liquid crystal layer held between the first substrate and the second substrate, a first control electrode, a second control electrode, a third control electrode, and a fourth control electrode, wherein the controller applying a first voltage for forming a first lens of a first shape in the liquid crystal layer, to the first control electrode and the second control electrode, and applying a second voltage for forming a second lens of a second shape at a position different from that of the first lens in the liquid crystal layer, to the third control electrode and the fourth control electrode, and the first shape being different from the second shape.

An embodiment will be described hereinafter with reference to the accompanying drawings. Note that the disclosure is a mere example presented for the sake of exemplification, and any modification and variation conceived within the scope and spirit of the invention by a person having ordinary skill in the art are naturally encompassed in the scope of invention of the present application. Further, a width, thickness, shape, and the like of each element are depicted schematically in the figures as compared to actual embodiments for the sake of simpler explanation, and they do not limit the interpretation of the invention of the present application. Furthermore, in the description and figures of the present application, structural elements having the same or similar functions will be referred to by the same reference numbers and detailed explanations of them that are considered redundant may be omitted.

FIG. 1 is a diagram showing a configuration example of a display device DSP of this embodiment. In the figure, a direction X, a direction Y and a direction Z are orthogonal to each other, but they may cross at an angle other than 90 degrees.

The display device DSP comprises a display panel PNL, an optical element OD, a liquid crystal element LD, a controller CT and the like.

For example, the display panel PNL is a liquid crystal display panel. The optical element OD is provided on a surface PNLa side, which is a display surface of the display panel PNL.

The liquid crystal element LD opposes the display panel PNL along the third direction Z. The liquid crystal element LD comprises a plurality of lenses 5. The lenses 5 are arranged along the first direction X, for example. As will be described later, the lenses 5 may be fixed into a predetermined shape at predetermined positions, or the shape and positions may be variable.

The controller CT comprises a display controller DCT and an optical controller OCT. The display controller DCT controls the display panel PNL. The optical controller OCT controls the liquid crystal element LD.

FIG. 2 is a diagram showing a basic configuration and an equivalent circuit, of the display panel shown in FIG. 1. The display panel PNL includes a display area DA which displays images and a non-display area NDA surrounding the display area DA. The display area DA comprises a plurality of pixels PX. Here, the pixel indicates a minimum unit which is individually controllable according to a pixel signal, and is provided, for example, in an area which includes a switching element provided in a position in which a scanning line and a signal line, which will be described later, cross each other.

The pixels PX are arranged in a matrix along the first direction X and the second direction Y. The display panel PNL includes a plurality of scanning lines (which may be referred to as gate lines) G (G1 to Gn), a plurality of signal lines (which may be referred to as data wiring lines or source lines) S (S1 to Sm), a common electrode CE and the like in the display area DA. The scanning lines G each extend in the first direction X and are arranged along the second direction Y. The signal lines S each extend in the second direction Y and are arranged along the first direction X. The scanning lines G and the signal lines S do not necessarily extend linearly but may be partially bent. The common electrode CE is provided over the pixels PX.

The scanning lines G are connected to a scanning line drive circuit GD, the signal lines S are connected to a signal line drive circuit SD, and the common electrode CE is connected to a common electrode drive circuit CD. The scanning line driving circuit GD, signal line driving circuit SD, and common electrode driving circuit CD are controlled by the display controller DCT.

Each pixel PX includes a switching element SW, a pixel electrode PE, the common electrode CE, a liquid crystal layer 13, and the like. The switching element SW is formed from, for example, a thin-film transistor (TFT) and is electrically connected to the respective scanning line G and signal line S. More specifically, the switching element SW includes a gate electrode WG, a source electrode WS, and a drain electrode WD. The gate electrode WG is electrically connected to the respective scanning line G. In the example illustrated, an electrode electrically connected to the signal line S is referred to as the source electrode WS, and an electrode electrically connected to the pixel electrode PE is referred to as the drain electrode WD. The respective scanning line G is connected to the switching element SW of each of the pixels PX arranged along the first direction X. The respective signal line S is connected to the switching element SW of each the pixels PX arranged along the second direction Y.

The pixel electrode PE is electrically connected to the switching element SW. The common electrode CE opposes a plurality of pixel electrodes PE. These pixel electrode PE and common electrode CE function as a drive electrode which drives the liquid crystal layer 13. A storage capacitor CS is formed, for example, between the common electrode CE and the pixel electrode PE.

Although a detailed explanation on the structure of the display panel PNL will be omitted here, the display panel PNL has a structure corresponding to one of various modes such as the twisted nematic (TN) mode, polymer dispersed liquid crystal (PDLC) mode, optically compensated bend (OCB) mode, electrically controlled birefringence (ECB) mode, vertical aligned (VA) mode, fringe field switching (FFS) mode and in-plane switching (IPS) mode. Further, the description provided here is directed to the case where each pixel PX is driven by an active mode, but each pixel PX may be driven by a passive mode.

FIG. 18 is a cross section showing a configuration example of the display panel PNL shown in FIG. 2. Note that only the structure required for explanation is illustrated. Here, when the light-traveling direction is along the third direction Z, the linearly polarized light which includes an oscillating surface along the first direction X is referred to as first polarized light POL1, and the linearly polarized light which includes an oscillating surface along the second direction Y is referred to as second polarized light POL2.

The display panel PNL comprises a substrate SUB1, substrate SUB2 and a liquid crystal layer LC.

The substrate SUB1 comprises an insulating substrate 100, an insulating film 110, an alignment film 120, a switching element SW, a pixel electrode PE and the like. The insulating substrate 100 and insulating film 110 are both transparent. The switching element SW is disposed between the insulating substrate 100 and the insulating film 110. The pixel electrode PE is arranged between the insulating film 110 and the alignment film 120 and is electrically connected to the switching element SW. For example, the pixel electrode PE is a reflective layer and is formed from a reflective metal material such as aluminum or silver. Although will not be described, the substrate SUB1 comprises the scanning lines G, the signal lines S, the switching elements SW and the like, shown in FIG. 2.

The substrate SUB2 comprises an insulating substrate 200, a light-shielding layer 210, a color filter 220, an overcoat layer 230, an alignment film 240, a common electrode CE and the like. The insulating substrate 200 is transparent. The light-shielding layer 210 is disposed between the insulating substrate 200 and the color filter 220. The color filter 220 is disposed between the light-shielding layer 210 and the overcoat layer 230. The overcoat layer 230 covers the color filter 220. The common electrode CE is disposed between the overcoat layer 230 and the alignment film 240. The common electrode CE is formed from, for example, a transparent conductive material such as indium tin oxide (ITO) or indium zinc oxide (IZO).

The liquid crystal layer LC is held between the substrate SUB1 and the substrate SUB2, and contains liquid crystal molecules LM.

The optical element OD is located on an opposite side to a surface of the substrate SUB2, which is brought into contact with the liquid crystal layer LC. The optical element OD comprises, for example, a scattering layer FS, a retardation film RT, a polarizer PL and the like. The scattering layer FS is adhered to the insulating substrate 200, the retardation film RT is stacked on the scattering layer FS and the polarizer PL is stacked on the retardation film RT.

The scattering layer FS is an anisotropic scattering layer which scatters incident light from a specific direction. In the example illustrated, the scattering layer FS comprises a function to transmit the incident light from the liquid crystal element LD without substantially scattering it and to scatter reflection light by the pixel electrodes PE. Note that it is preferable to stack a plurality of sheets of scattering layers FS in order to prevent expansion of the diffusion range and rainbow hue. The retardation film RT has a function as a quarter-wave plate. For example, the retardation film RT is a multi-layered body in which a quarter-wave plate and a half-wave plate are stack one on another, and is configured to reduce the wavelength dependence and to be able to obtain a desired phase difference in the wavelength range used for color display. The polarizer PL comprises a transmission axis T passing through the second polarized light POL2. Note that the structure of the optical element OD is not limited to that of the example illustrated.

The pixel electrode PE and the common electrode CE form an electric field in the liquid crystal layer LC. As a result, the retardation of the liquid crystal layer LC varies. More specifically, between an OFF state, in which an electric field is not formed in the liquid crystal layer LC, and an ON state, in which the electric field was formed in the liquid crystal layer LC, the alignment state of the liquid crystal element LM differ, and the retardation varies. The pixel electrode PE is a reflecting electrode, and it selectively reflects external light entering via the substrate SUB2 and displays images due to the difference in retardation between the ON state and OFF state in the reflective display panel in which the common electrode CE is a clear electrode.

The polarizer PL of the optical element OD transmits the second polarized light POL2 of the transmission light of the liquid crystal element LD. Thus, the display panel PNL is illuminated by the second polarized light POL2. In the ON state, the light entering the display panel PNL passes through the liquid crystal layer LC after being reflected by the pixel electrode PE, and is transmitted by the optical element OD. As a result, the color of the color filter 220 is displayed in the ON state. On the other hand, in the OFF state, the light entering the display panel PNL passes through the liquid crystal layer LC after being reflected by the pixel electrode PE and it is absorbed by the optical element OD. As a result, black is displayed in the OFF state.

Figure 4:
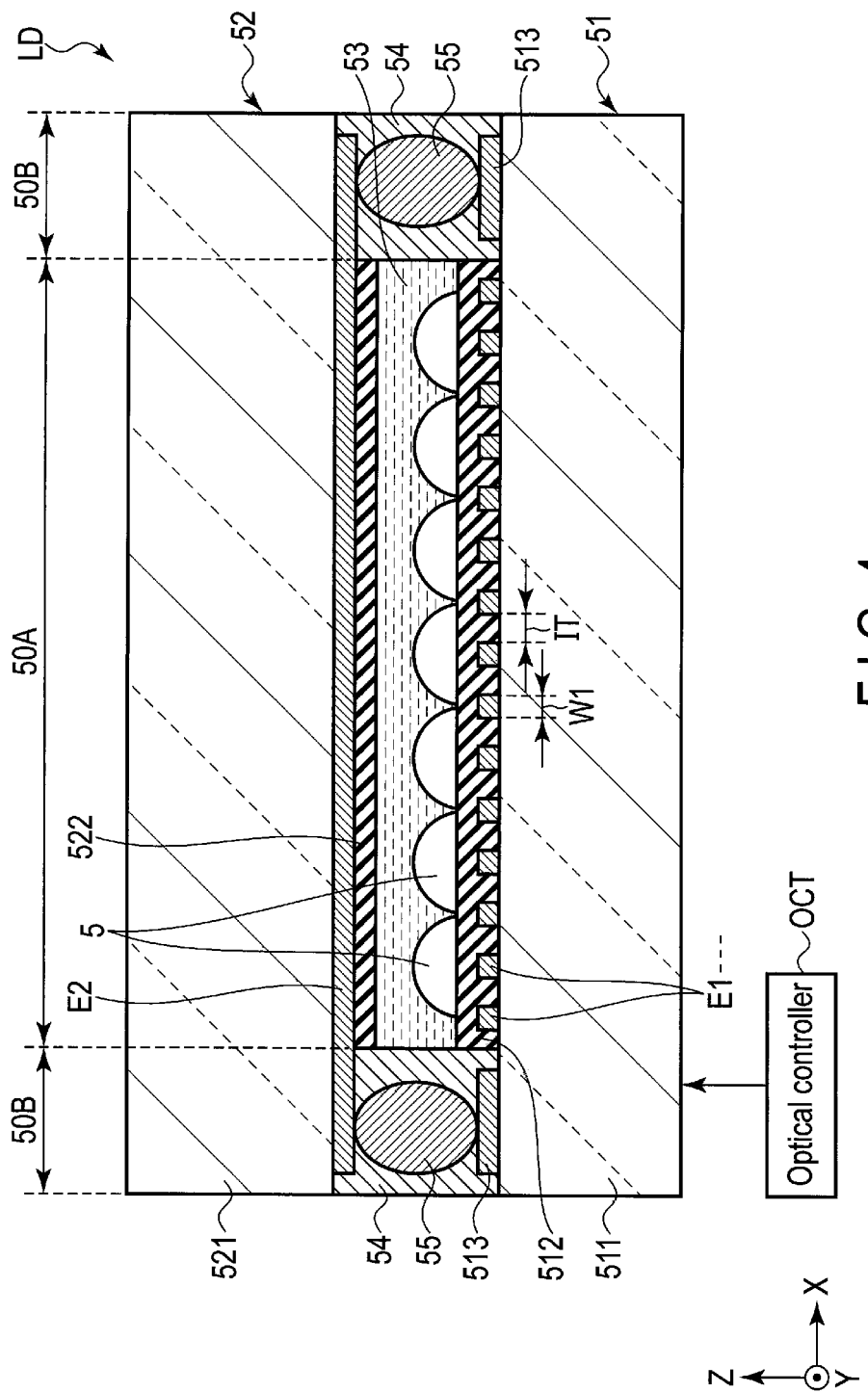
FIG. 4 is a cross section showing a structural example of a liquid crystal element.

FIG. 4 is a cross section showing a configuration example of the liquid crystal element LD.

The liquid crystal element LD comprises a first substrate 51, a second substrate 52 and a liquid crystal layer 53.

The first substrate 51 comprises an insulating substrate 511, a plurality of first control electrodes E1, an alignment film 512 and power supply lines 513. The first control electrodes E1 are located between the insulating substrate 511 and the liquid crystal layer 53. The first control electrodes E1 are arranged along the first direction X at intervals in an effective area 50A. For example, a width W of the first control electrodes E1 along the first direction X is equal to or less than an interval IT between each adjacent pair of the first control electrodes E1 along the first direction X. The alignment film 512 covers the first control electrode E1 and is brought into contact with the liquid crystal layer 53. The power supply lines 513 are located respectively in non-effective areas 50B on outer sides of the effective region 50A.

The second substrate 52 comprises an insulating substrate 521, a second control electrode E2 and an alignment film 522. The second control electrode E2 is located between the insulating substrate 521 and the liquid crystal layer 53. The second control electrode E2 is a single plate electrode, for example, located on substantially the entire effective area 50A and extending also to the non-effective area 50B. The second control electrode E2 opposes the first control electrode E1 through the liquid crystal layer 53 in the effective area 50A. The second control electrode E2 opposes the power supply lines 513 in the non-effective area 50B. The alignment film 522 covers the second control electrode E2, and is brought into contact with the liquid crystal layer 53.

The insulating substrates 511 and 521 are, for example, glass substrates or resin substrates. The first control electrode E1 and the second control electrode E2 are formed from a transparent conductive material such as ITO or IZO. The alignment films 512 and 522 are, for example, horizontal alignment films and both have subjected to alignment process along the first direction X.

The first substrate 51 and the second substrate 52 are attached together with a sealant 54 in the non-effective areas 50B. The sealant 54 includes a conductive material 55. The conductive material 55 is interposed between each power supply line 513 and the second control electrode E2, and electrically connects each power supply line 513 and the second control electrode E2 to each other.

The liquid crystal layer LQ is held between the first substrate SUB1 and the second substrate SUB2. The liquid crystal layer 53 is formed from, for example, a liquid crystal material having positive dielectric anisotropy. To the first control electrode E1 and the second control electrode E2, a voltage to form the lenses 5 is applied to the liquid crystal layer 53.

The optical controller OCT can switch a mode in which the lenses 5 are formed in the liquid crystal layer 53 and a mode in which no lens are not formed in the liquid crystal layer 53 by controlling the voltage supplied to each of the first control electrodes E1 and the second control electrode E2. Further, the optical controller OCT can control the positions of formation the lenses 5 by controlling the voltage supplied to each of the first control electrode E1. Furthermore, the optical controller OCT can also control the size and shape of the lenses 5 freely by controlling the voltage supplied to each of the first control electrodes E1.

In the example illustrated, the first control electrodes E1 are formed on the first substrate 51 and the second control electrode E2 is formed on the second substrate 52, but the first control electrode E1 and the second control electrode E2 may be both formed in a same substrate, the first substrate 51 or the second substrate 52.

Figure 5:
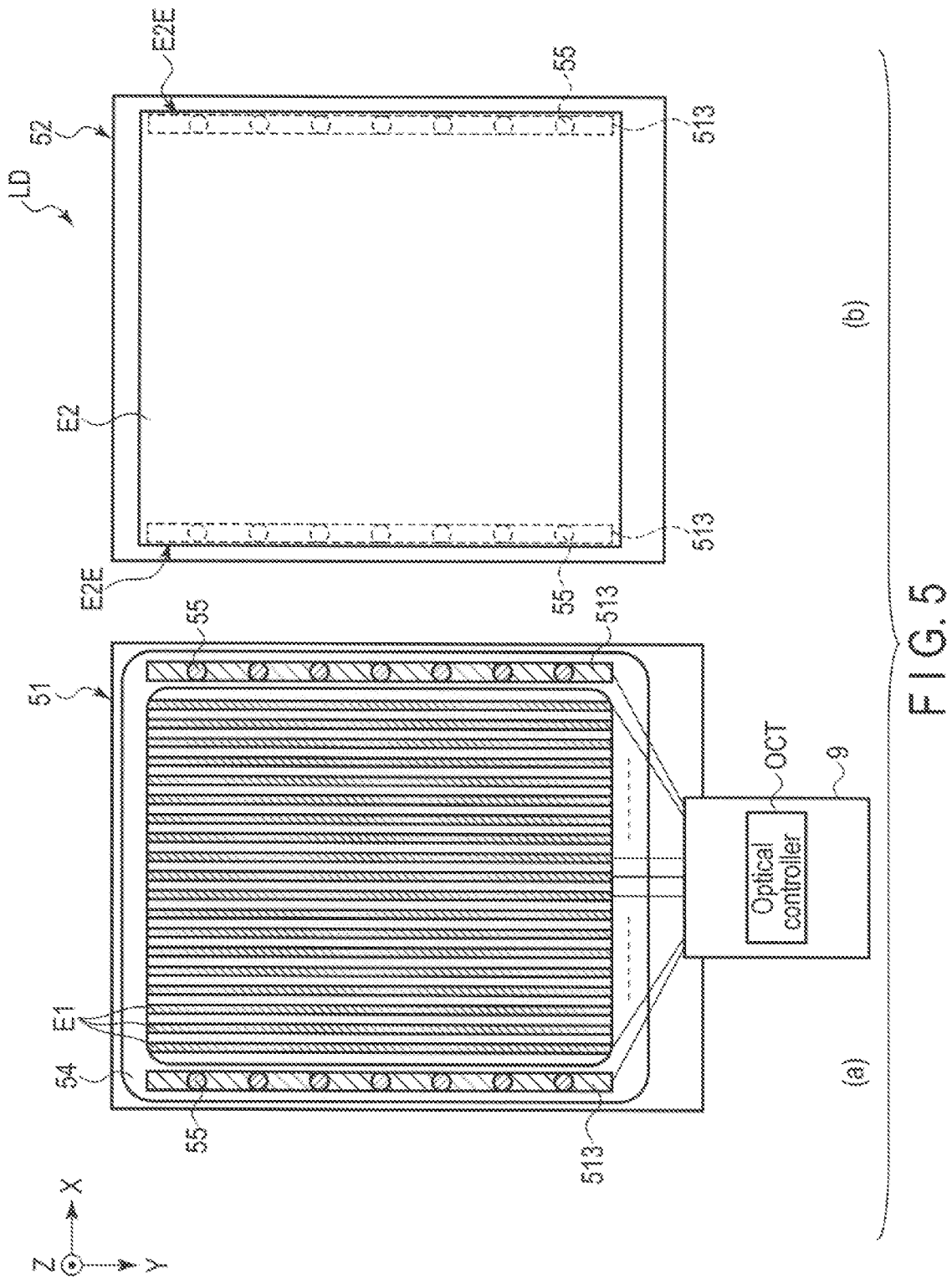
FIG. 5 is a plan view showing a structural example of the liquid crystal element.

FIG. 5 is a plan view showing a conventional example of the liquid crystal element LD. FIG. 5, part (a) is a plan view of the first substrate 51, and part (b) is a plan view of the second substrate 52.

In the first substrate 51 shown in FIG. 5, part (a), the sealant 54 is formed into a frame shape. The first control electrodes E1 are located on an inner side surrounded by the sealant 54, and arranged along the first direction X at intervals. Each of the first control electrodes E1 is, for example, a strip electrode extending along the second direction Y. Note that the first control electrodes E1 each may be a strip electrode extending along the first direction X, or may be island-like electrodes arranged along the first direction X and the second direction Y. The shape of the island-like electrodes is a polygon such a quadrangle or a hexagon, or a round. The power supply lines 513 extend along the second direction Y in positions overlapping the sealant 54. The conductive material 55 included in the sealant 54 at least partially overlaps the power supply lines 513 thereon. The wiring substrate 9 is connected to the first substrate 51 to electrically connect each of the first control electrodes E1 and the power supply lines 513 to the optical controller OCT.

In the second substrate 52 shown in FIG. 5, part (b), the second control electrode E2 is formed into a quadrangle and includes an end E2E extending along the second direction Y. The end E2E overlaps the power supply lines 513 and the conductive materials 55. That is, the second control electrode E2 is electrically connected to the optical controller OCT via the conductive materials 55 and the power supply lines 513.

Figure 6:
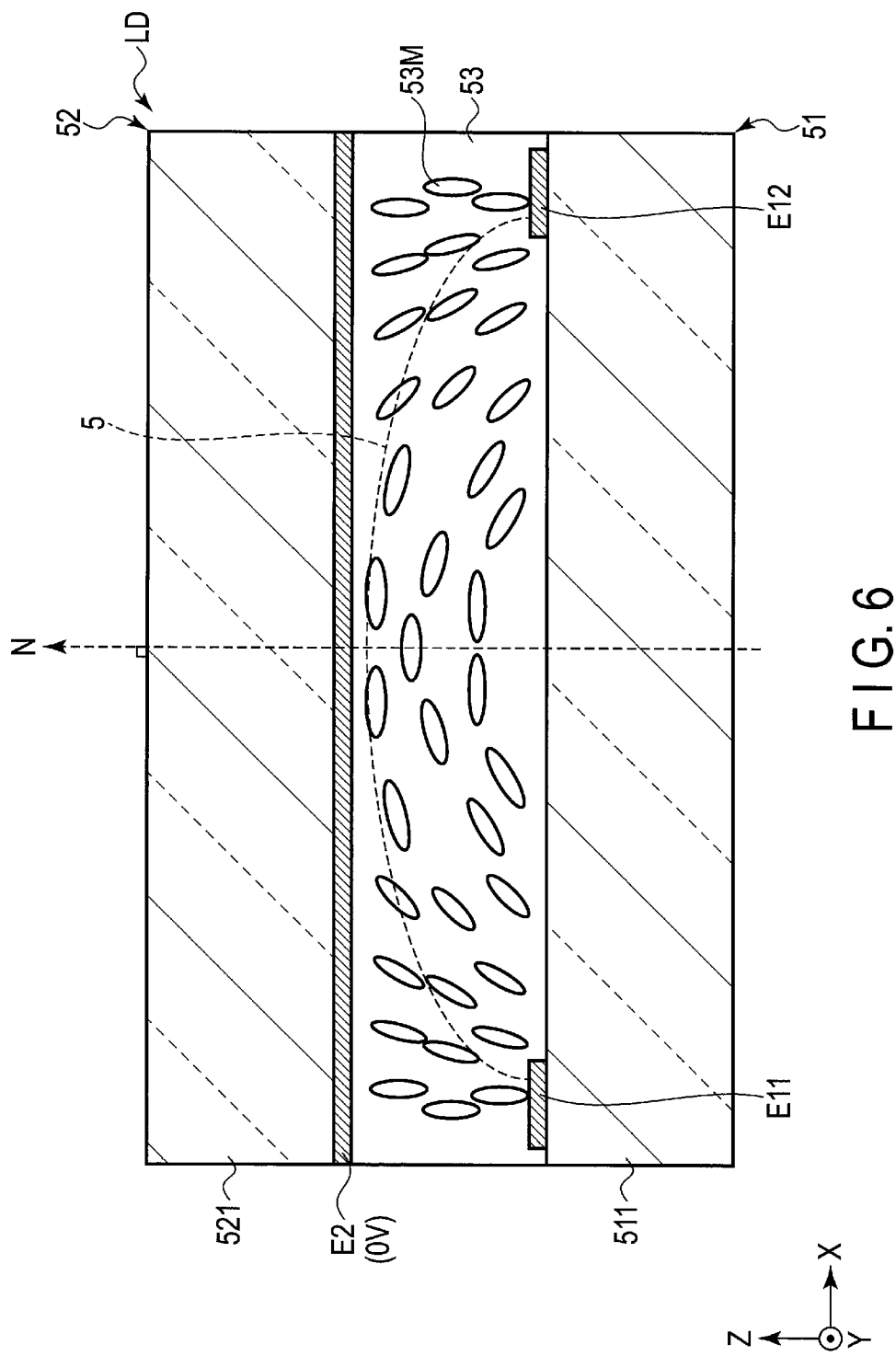
FIG. 6 is a diagram illustrating a lens formed in the liquid crystal layer.

FIG. 6 is a diagram illustrating the lenses 5 formed in the liquid crystal layer 53. Note that only the structure required for explanation is illustrated in FIG. 6. Here, the same voltage is supplied to two first control electrodes E11 and E12, and a voltage different from that of the first control electrodes E11 and E12 is supplied to the second control electrode E2.

For example, the liquid crystal layer 53 has positive dielectric anisotropy as described above. The liquid crystal molecules 53M contained in the liquid crystal layer 53 are initially aligned so as to align the longitudinal axis thereof along the first direction X while an electric field is not being formed, and to align the longitudinal axis along the electric field while an electric field is being formed.

For example, a voltage of 6V is supplied to the first control electrode E11, a voltage of −6V is supplied to the first control electrode E12, and a voltage of 0V is supplied to the second control electrode E2. In a region where each of the first control electrodes E11 and E12 opposes the second control electrode E2, an electric field is formed along the third direction Z; therefore the liquid crystal molecules 53M are aligned so that the longitudinal axis thereof is along the third direction Z. In a region between the first control electrode E11 and the first control electrode E12, an electric field inclined with respect to the third direction Z is formed and therefore the liquid crystal molecules 53M are aligned so that the longitudinal axis thereof is inclined to the third direction Z. In a middle region between the first control electrode E11 and the first control electrode E12, an electric field is not substantially formed or an electric field is formed along the first direction X; therefore the liquid crystal molecules 53M are aligned so that the longitudinal axis thereof is along the first direction X.

The liquid crystal molecules 53M have a refractive-index anisotropy Δn. Therefore, the liquid crystal layer 53 has a refractive-index distribution according to the alignment state of the liquid crystal molecules 53M. Or, when the thickness along the third direction Z of the liquid crystal layer 53 is set to d, the liquid crystal layer 53 has a distribution of retardation represented by Δn·d or a phase distribution. Note that the thickness d is, for example, is 10 μm to 100 μm. The lenses 5 indicated by a dotted line in the figure is formed by such refractive-index distribution, distribution of retardation or phase distribution. The lenses 5 illustrated function as convex lenses. Moreover, the lenses 5 illustrated has a shape substantially symmetrical to the normal N of the liquid crystal element LD between the first control electrode E11 and the first control electrode E12.

In the embodiment, the liquid crystal element LD comprising the lenses 5 is described in connection with an example of the mode which combines the liquid crystal layer 53 which initially aligns the molecules horizontally along the main surface of the substrate with the electric field degenerated along a direction crossing the main surface of the substrate, but the embodiment is not limited to this. For example, it may be combined with the liquid crystal layer initially aligned substantially vertical to the main surface of the substrate, or with an electric field along the main surface of the substrate. Thus, as long as it is a mode in which the refractive-index distribution is variable according to the electric field applied to the liquid crystal layer, a liquid crystal element comprising the lenses 5 can be realized. Here, the main surface of the substrate here is a X-Y plane defined by the first direction X and the second direction Y.

Figure 7:
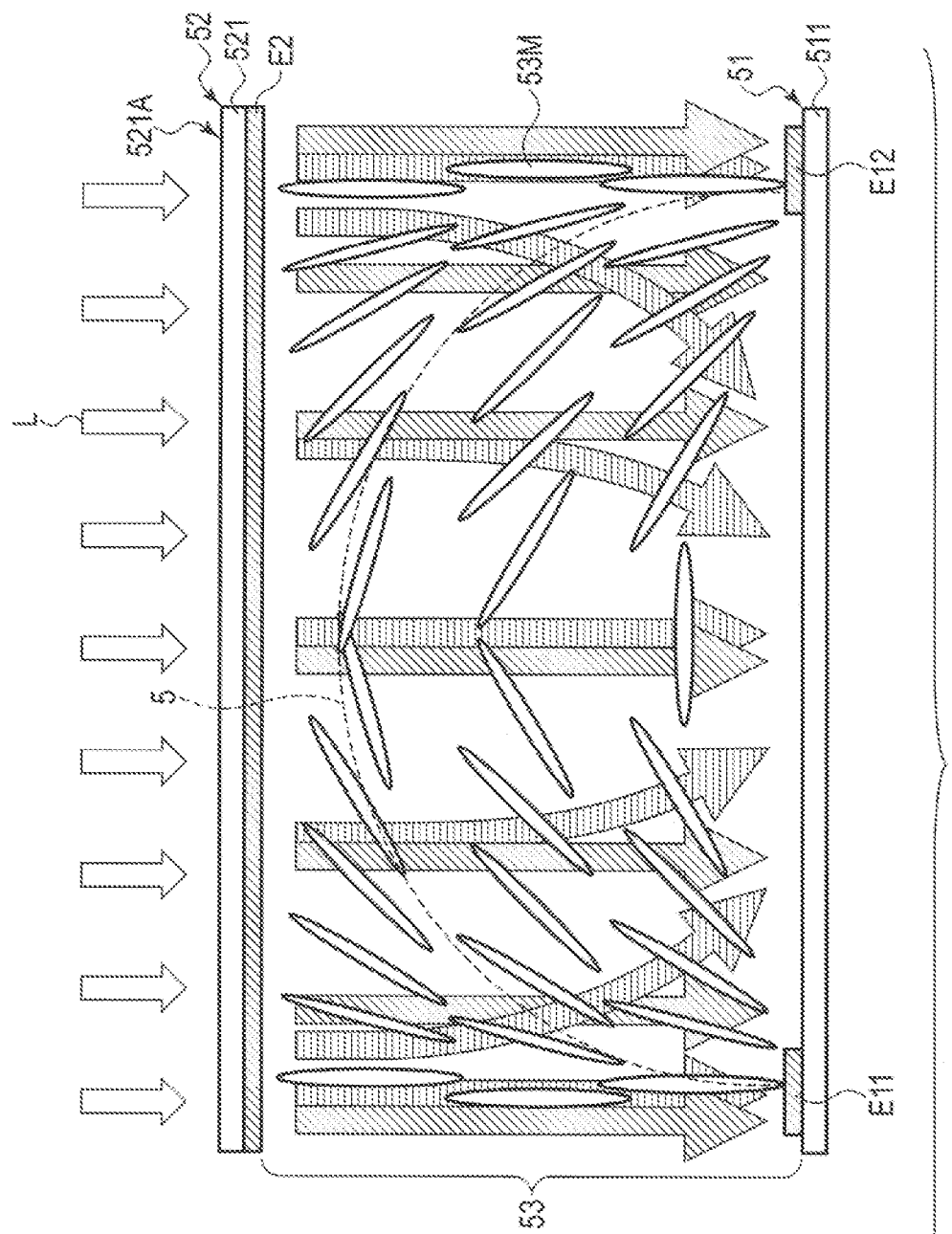
FIG. 7 is a diagram illustrating action of the lens shown in FIG. 6.

FIG. 7 is a diagram illustrating action of the lenses 5 shown in FIG. 6. In the example illustrated, the light-traveling direction is opposite to that represented by an arrow indicating the third direction Z. The first polarized light POL1 is indicated by an arrow having a slash stripe pattern in the figure, and the second polarized light POL2 is indicated by an arrow having a horizontal stripe pattern in the figure. The light L is, for example, natural light having a random oscillating surface, and it enters from an external surface 521A of the insulating substrate 521 and travels toward the first substrate 51 from the second substrate 52.

The lenses 5 have different actions to the first polarized light POL1 and the second polarized light POL2, respectively. More specifically, the lenses 5 pass through the first polarized light POL1 of the light L without being substantially refracted, and refract the second polarized light POL2.

FIG. 8 is a diagram showing an example of the shape of the lenses 5. Here, an example of the shape of the lenses 5 which can be formed by the liquid crystal element LD, a configuration example of which is shown in FIG. 5, will be described.

For example, the first control electrodes E11 to E13 are arranged along the first direction X, and each of the first control electrodes E11 to E13 is a strip electrode extending along the second direction Y. Further, the second control electrode E2 is a single plate electrode extending along the X-Y plane.

The lenses 5 are convex lenses (cylindrical lenses) each comprising a curved surface having a bus-bar extending along the second direction Y and projecting in the third direction Z. In the conventional example in which the lenses 5 extend along the second direction Y, the lenses 5 can control the focusing position where light is focused along the first direction X according to the incident angle of entering light. In configuration example in which each of the first control electrodes E11 to E13 is each a strip electrode extending along the first direction X, the lenses 5 extending along the first direction X are formed. In the conventional example in which the lenses 5 extend along the first direction X, the lenses 5 can control the focusing position where light is focused along the second direction Y according to the incident angle of entering light.

FIG. 9 is a diagram showing another example of the shapes of the lenses 5. The configuration example shown in FIG. 9 is different from that of FIG. 8 in that a plurality of second control electrodes E21 to E23 are arranged along the second direction Y at intervals and each of the second control electrodes E21 to E23 is a strip electrode extending along the first direction X. That is, the extending direction of the second control electrodes E21 to E23 crosses the extending direction of the first control electrodes E11 to E13.

In such a configuration example, lenses 5A and 5B are formed by supplying predetermined voltages mainly to the first control electrodes E11 to E13, respectively and lenses 5E and 5F are formed by supplying predetermined voltages mainly to the second control electrodes E21 to E23, respectively. The lenses 5A and 5B are convex lenses each comprising a curved surface having a bus-bar extending along the second direction Y and projecting upward along the third direction Z. Moreover, the lenses 5E and 5F are convex lenses each comprising a curved surface having a bus-bar extending along the first direction X and projecting downward along the third direction Z.

For example, the voltages of the second control electrodes E21 to E23 are all set to 0V, that of the first control electrode E11 is set to −6V, that of the first control electrode E12 is set to 6V, and that of the first control electrode E13 is set to −6V, and thus the lenses 5A and 5B can be formed without forming the lenses 5E and 5F. Similarly, those of the first control electrodes E11 to E13 are set to 0V, that of the second control electrode E21 is set to −6V, that of the second control electrode E22 is set to 6V, that of the second control electrode E23 is set to −6V, and thus the lenses 5E and 5F can be formed without forming the lenses 5A and 5B.

Figure 10:
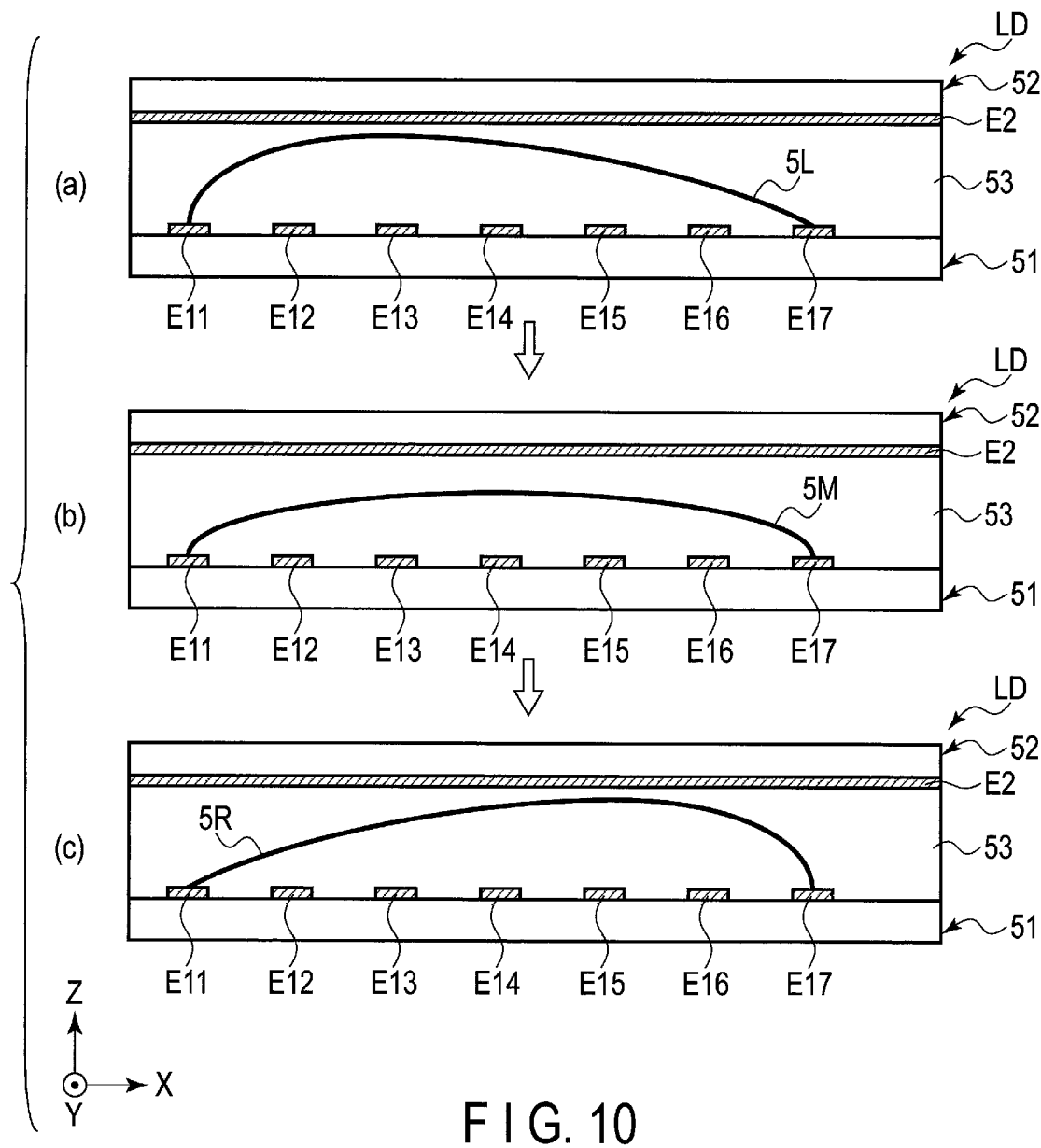
FIG. 10 is a diagram illustrating an example of formation of the lens.

FIG. 10 is a diagram illustrating an example of formation of the lenses 5.

In a state where the voltage of the first control electrode E13 among the first control electrodes E11 to E17 arranged along the first direction X becomes minimum with respect to the voltage of the second control electrode E2 as shown in FIG. 10, part (a), a lens 5L which is asymmetrical over the first control electrodes E11 to E17 is formed. The lens 5L as such can be formed by setting, for example, the voltages of the first control electrodes E11 to E17 to 6V, 2V, 0V, 1V, 3V, 5V and 6V, respectively, and that of the second control electrode E2 to 0V.

In a state where the voltages of the first control electrodes E11 to E17 are set to the same voltage and the voltages of the first control electrodes E12 to E17 are set to 0V or less than that of the first control electrode E11 as shown in FIG. 10, part (b), a lens 5M symmetrical over the first control electrodes E11 to E17 is formed.

In a state where the voltage of the first control electrode E15 among the first control electrodes E11 to E17 becomes minimum with respect to the voltage of the second control electrode E2 as shown in FIG. 10, part (c), a lens 5R asymmetrical over the first control electrodes E11 to E11 is formed. The lens 5R as such can be formed by setting, for example, the voltages of the first control electrodes E11 to E17 to 6V, 5V, 3V, 1V, 0V, 2V and 6V, respectively, and setting the voltage of the second control electrode E2 to 0V.

In such a configuration example, by the asymmetrically shaped lenses 5L and 5R, the emitting direction can be controlled in the first direction X in the X-Y plane.

Figure 11:
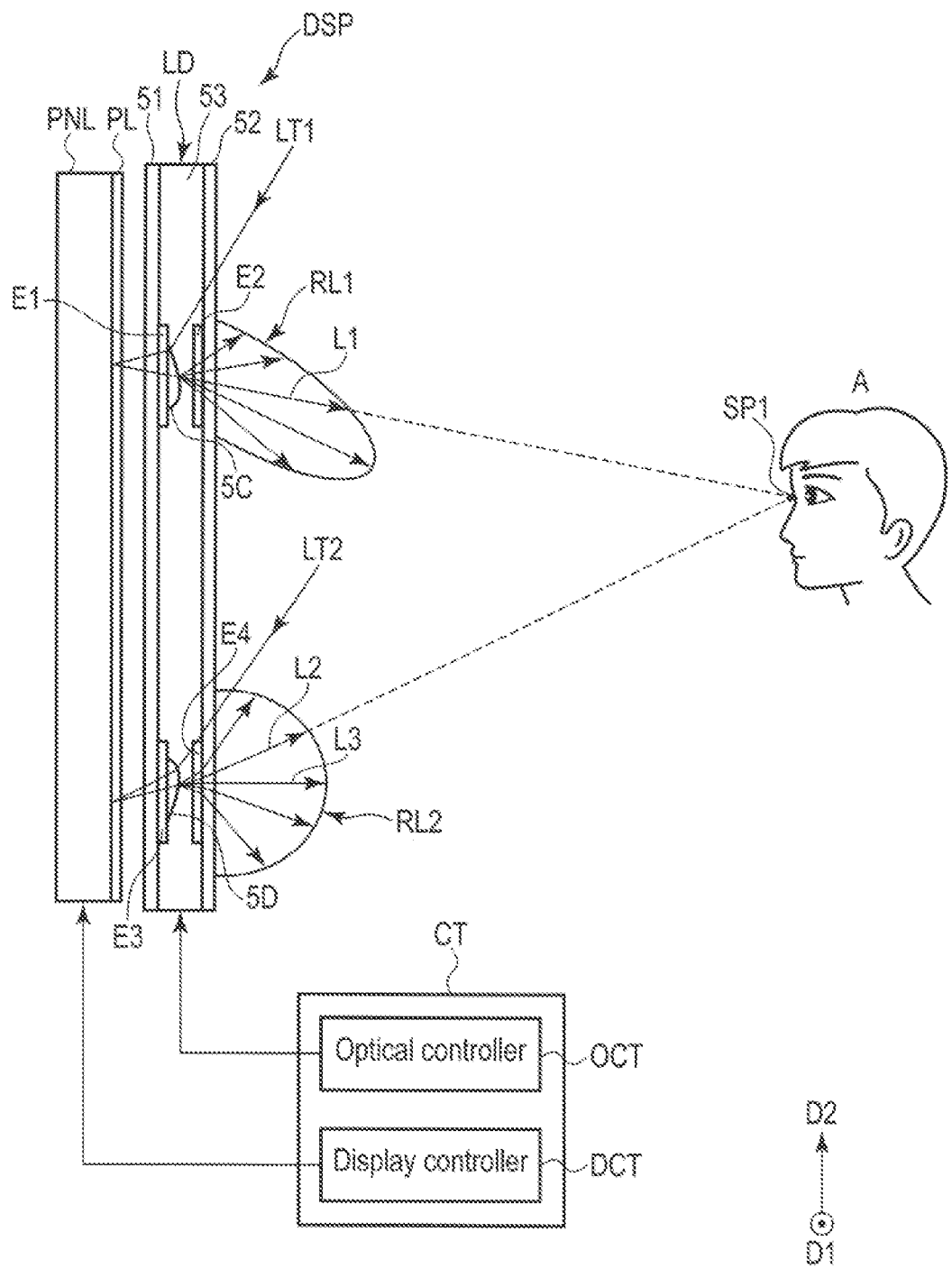
FIG. 11 is a diagram illustrating the case where an observer A observes the display device.

FIG. 11 is a diagram illustrating a case where an observer A observes the display device DSP. In the example illustrated, the observer A is located at a first position SP1. The display panel PNL and the liquid crystal element LD are arranged parallel to a plane defined by directions D1 and D2. The directions D1 and D2 are normal to each other.

The liquid crystal element LD comprises the first control electrode E1, the second control electrode E2, the third control electrode E3 and the fourth control electrode E4. In the example illustrated, the first control electrode E1 and the third control electrode E3 are disposed on the first substrate 51. Further, the second control electrode E2 and the fourth control electrode E4 are disposed on the second substrate 52.

The first lens 5C is formed in the liquid crystal layer 53 by applying the respective voltages to the first control electrode E1 and the second control electrode E2. The second lens 5D is formed in the liquid crystal layer 53 by applying the respective voltages to the third control electrode E3 and the fourth control electrode E4. The first lens 5C and the second lens 5D are asymmetrical lenses as shown in FIG. 10 and are formed in the liquid crystal layer 53. In the liquid crystal layer 53, the first lens 5C and the second lens 5D are formed at different positions. Further, the first lens 5C is formed into a first shape and the second lens 5D is formed into a second shape different from the first one. Here, for example, the first shape is equivalent to the lens 5R shown in FIG. 10, and the second shape is equivalent to the lens 5L shown in FIG. 10.

The controller CT applies the first voltage for forming the first lens 5C of the first shape in the liquid crystal layer 53, to the first control electrode E1 and the second control electrode E2. The controller CT applies the second voltage for forming the second lens 5D of the second shape in the liquid crystal layer 53, to the third control electrode E3 and the fourth control electrode E4.

The incidence light LT1 and LT2 enter the liquid crystal element LD substantially at the same angle. The first lens 5C refracts the incidence light LT1 to enter the display panel PNL. The second lens 5D refracts the incidence light LT2 to enter the display panel PNL. The light entering the first lens 5C and the second lens 5D is refracted so as to decrease the angle with respect to the normal direction of the display panel PNL.

Here, the first lens 5C and the second lens 5D are different from each other in shape, and naturally the refraction angles of the incidence lights LT1 and LT2 also differ from each other. Therefore, the incident angles of the incidence light LT1 and LT2 are substantially the same as each other, whereas the reflection light RL1 reflecting as the incidence light LT1 passing through the first lens 5C and the reflection light RL2 reflecting as the incidence light LT2 passing through the first lens 5D are different from each other in light intensity depending on direction. That is, for example, the light L1 of the reflection light RL1 and the light L3 of the reflection light RL2 reflect in the same direction, i.e., they are reflected in parallel, but the light L3 is less in intensity.

Of the reflection light RL1, the light L1 is light reflecting toward the first position SP1. Of the reflection light RL2, the light L2 is light reflecting toward the first position SP1. The light L1 and light L2 are reflected not in parallel but in directions different from each other. In the embodiment, the light L1 and light L2 are substantially equal to each other in intensity. That is, the light having passed the first lens 50 and that of the second lens 5D, which are observed at the first position SP1 are equal to each other in quantity of light.

As described above, the intensity of the reflection light according to the direction, which depends on the position within the plane of the display panel PNL can be adjusted by controlling the lenses, thereby making it possible to improve the uniformity in the luminance viewed by the observer A.

Note that the transmission axis of the polarizer PL and the refracted polarized light of the incidence light are equal in direction. More specifically, as shown in FIG. 3, the polarizer PL comprises a transmission axis T transmitting the second polarized light POL2, and as shown in FIG. 7, the lenses do not substantially refracts the first polarized light POL1 while transmission, but refracts the second polarized light POL2. That is, the second polarized light POL2 refracted by the liquid crystal element LD passes through the polarizer PL, whereas the first polarized light POL1 hardly refracted by the liquid crystal element LD is absorbed by the polarizer PL.

Moreover, the shapes of the first lens 5C and the second lens 5D may be fixed. That is, the positions of the observer A and the light source may be stored in advance in the controller CT, and the shapes of the lenses may be determined in advance. Or, the shapes of the lenses may be changed by varying the voltage applied to each of the first to fourth control electrodes.

According to this embodiment, the first lens 5C and the second lens 5D, which have different shapes from each other, are formed in the liquid crystal element LD, and thus the directivity and intensity of the reflection light RL1 and RL2 can be changed according to the position of the display panel PNL. In this manner, when the observer A observes the display panel PNL from the first position SP1, the display panel PNL can be viewed with substantially uniform luminance. Further, it is not necessary to lower the degree of polarization by the polarizer to improve the reflectivity of the display panel PNL, and therefore the luminance of the display viewed can be improved without degrading the contrast.

Further, as will be described, the shapes of the lenses may be changed according to the incident direction of external light or the position of the observer. Or, the forms of the lenses may be controlled to change by time.

Figure 12:
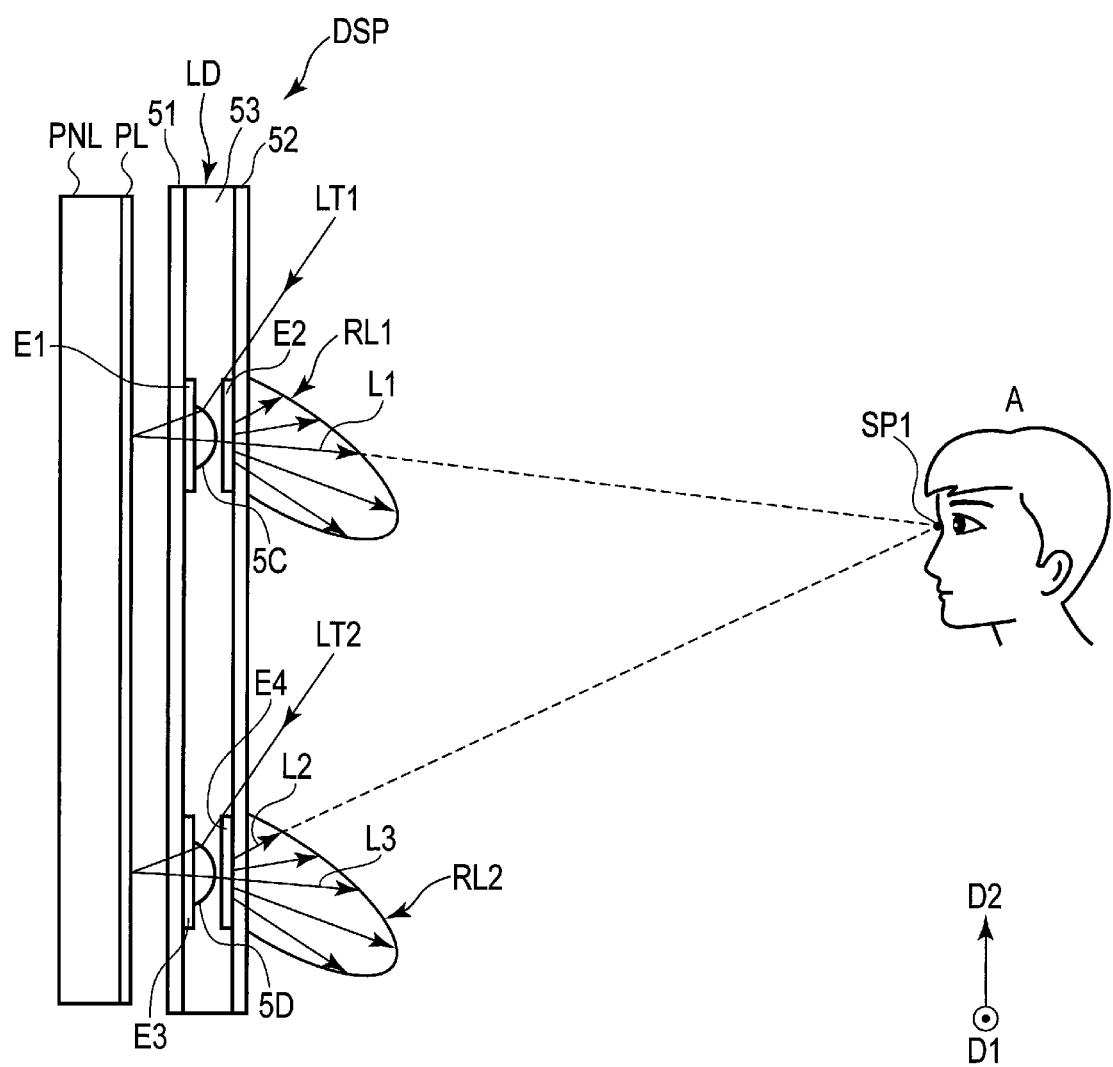
FIG. 12 is a diagram showing a comparative example of the liquid crystal element of the embodiment.

FIG. 12 is a diagram showing a comparative example of the liquid crystal element LD of the embodiment. The configuration example shown in FIG. 12 is different from that of FIG. 11 in that the first lens 5C and the second lens 5D are identical in shape.

Since the shapes of the first lens 5C and the second lens 5D are identical to each other, the angles of refraction of the incidence light LT1 and light LT2 are equal to each other. Therefore, the intensities of the reflection light RL1 and the reflection light RL2 by direction are equal to each other. More specifically, for example, the light L1 of reflection light RL1 and the light L3 of the reflection light RL2 are those reflected in the same direction, that is, those reflected in directions parallel to each other, and they are equal to each other in intensity.

In the example illustrated, the intensity of the light L1 is higher than that of the light L2. Therefore, from the first position SP1, an upper portion of the display panel PNL is viewed more luminous. Thus, in the comparative example in which the first lens 5C and the second lens 5D are identical in shape, it is difficult to obtain a display device DSP viewable at uniform luminance.

Figure 13:
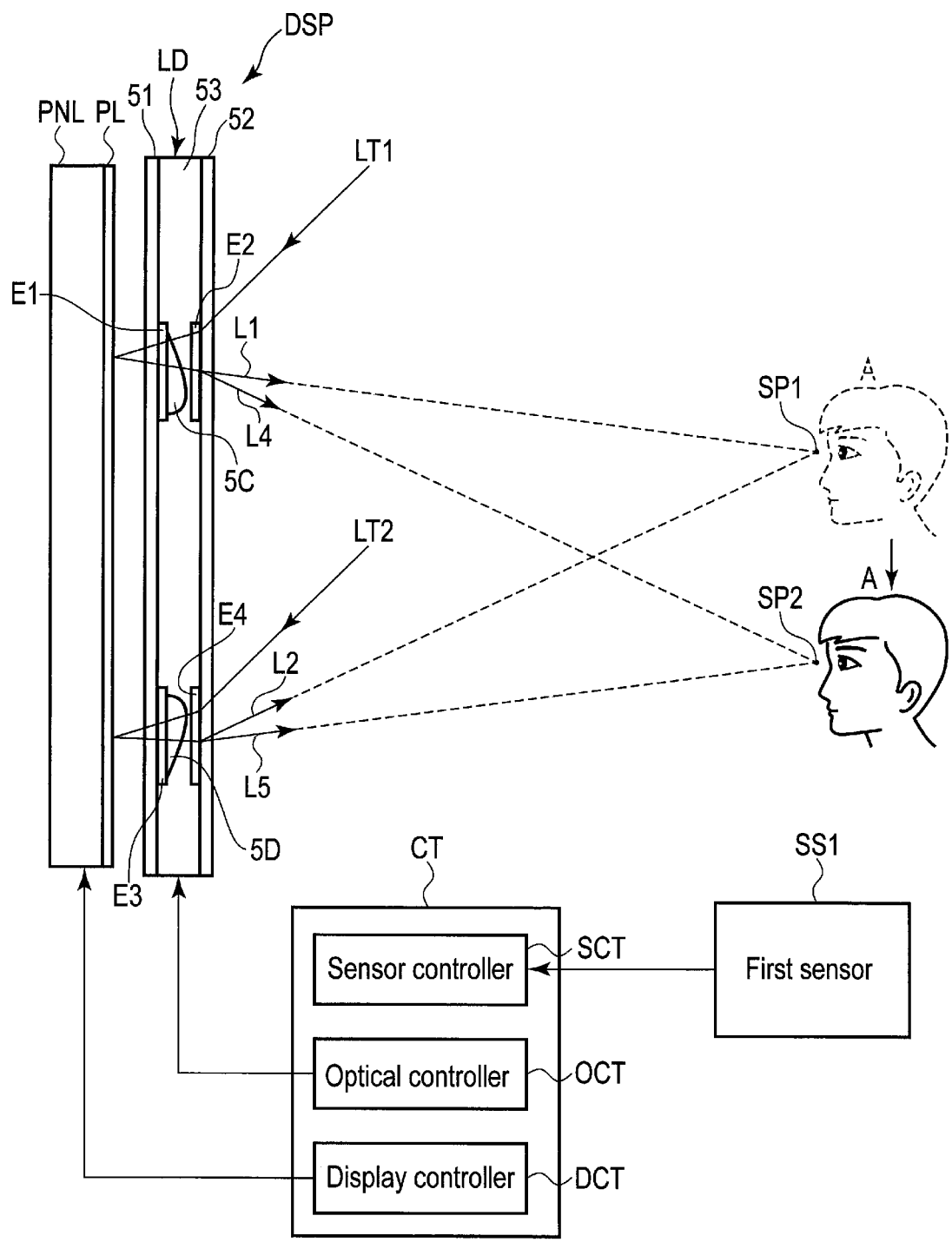
FIG. 13 is a diagram showing an example of the display device according to the embodiment.

FIG. 13 is a diagram showing an example of the display device DSP according to the embodiment. FIG. 13 is a diagram showing the case where the observer A moves from the first position SP1 to the second position SP2 to observe the display device DSP from the second position SP2.

The display device DSP comprises a first sensor SS1 which detects the position of the observer A. The first sensor SS1 detects the position of the observer A and outputs the results to a sensor controller SCT. The controller CT controls the liquid crystal element LD based on the output of the first sensor SS1. That is, as the observer A moves to the second position SP2 from the first position SP1, the controller CT changes the shapes of the first lens 5C and the second lens 5D.

The first lens 50 changes to a third shape different form that of the first shape shown in FIG. 10. The second lens 5D changes to a fourth shape different from that of the second shape shown in FIG. 10. The third shape and the fourth shape are different from each other.

The controller CT applies a third voltage for forming the first lens 5C of the third shape in the liquid crystal layer 53, to the first control electrode, E1 and the second control electrode E2. Further, the controller CT applies a fourth voltage for forming the second lens 5D of the fourth shape, to the third control electrode E3 and the fourth control electrode E4.

For example, of the reflection light of the incidence light LT1 passing through the first lens 5C and then reflected, light L4 is light reflected toward the second position SP2. Of the reflection light of the incidence light LT2 passing through the second lens 5D and then reflected, light L5 is light reflected toward the second position SP2. The light L4 and light L5 are reflected not in directions parallel to each other, but in directions different from each other. In the embodiment, the intensity of the light L4 is substantially equal to that of the light L5. That is, the quantity of light having passed through the first lens 5C and that of the second lens 5D, observed at the second position SP2, are equal to each other. Even if the position of the observer A changes as illustrated in the figure, the shapes of the first lens 5C and the second lens 5D change to improve the uniformity in luminance of the display panel PNL viewed by the observer A can be improved.

In the example just described, an advantageous effect similar to that of the embodiment above can be obtained.

Figure 14:
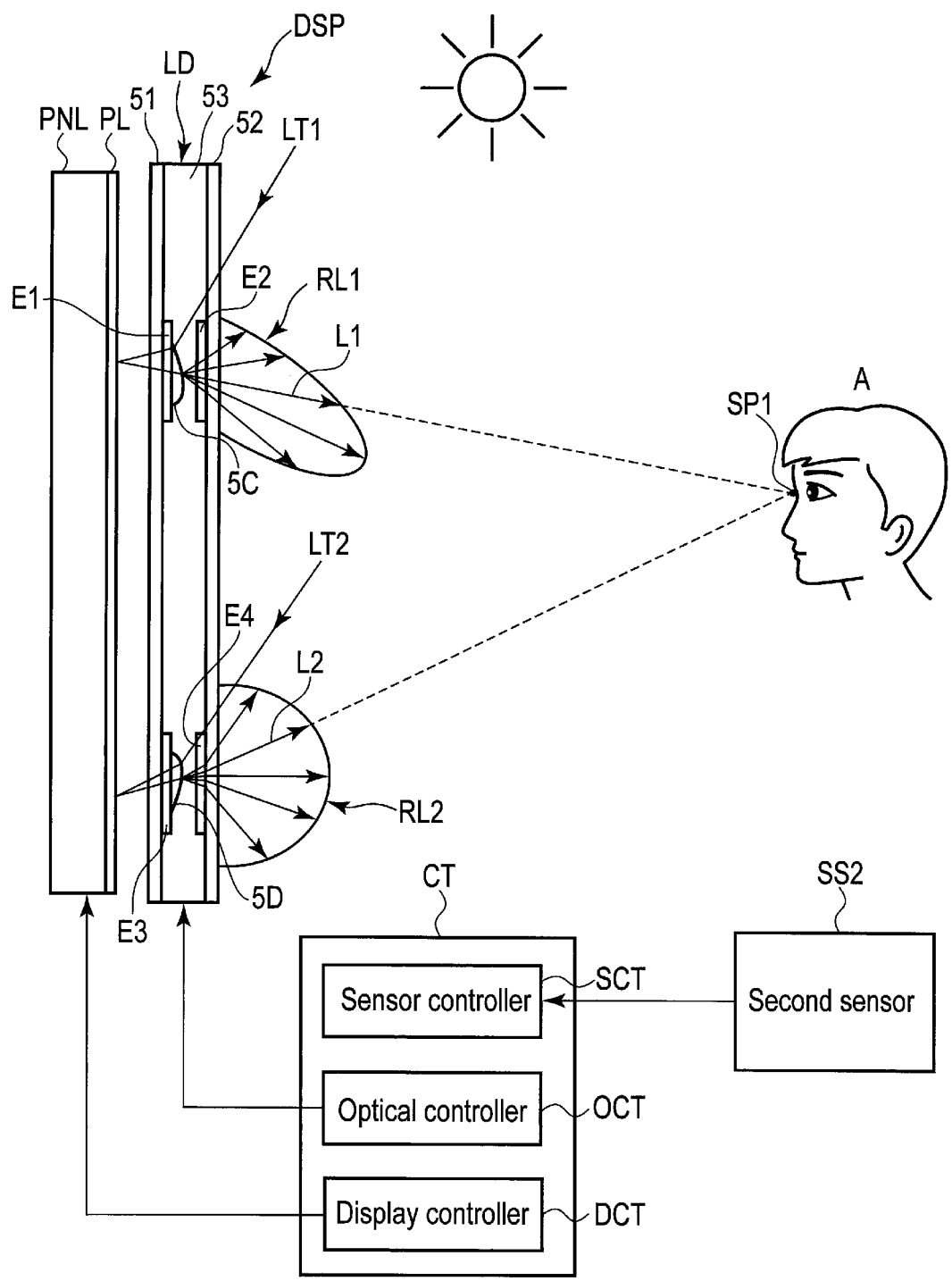
FIG. 14 is a diagram showing another example of the display device according to the embodiment.

FIG. 14 is a diagram showing another example of the display device DSP according to the embodiment.

The display device DSP comprises a second sensor SS2 which detects the intensity of light. The second sensor SS2 detects the position and intensity of external light and outputs the results to the sensor controller SCT. The controller CT controls the liquid crystal element LD based on the position and intensity of the external light detected by the second sensor SS2. For example, the controller CT calculates out a direction in which the intensity of incidence light is highest with respect to the direction of the transmission axis of the polarizer, and controls the shapes of the first lens 5C and the second lens 5D from the direction thus calculated. Here, by controlling the shapes of the first lens 5C and the second lens 5D, the external light can be utilized for the display panel PNL to be viewed by the observer A with the optimal luminance. According to the display device DSP as described above, the use efficiency of light to the direction of the observer A, which may be natural light such as sunlight or that of an illumination device, can be improved.

The examples shown in FIGS. 13 and 14 illustrate the first sensor SS1 which detects the position of the observer A and the second sensor SS2 which detects the position and intensity of external light, but the types of the sensors are not limited to these. The display device may comprise some other type of sensor. In such a case as well, the controller CT may just determine the shape of a lens based on the feedback from the sensor.

In the example just described, an advantageous effect similar to that of the embodiment above can be obtained.

Figure 15:
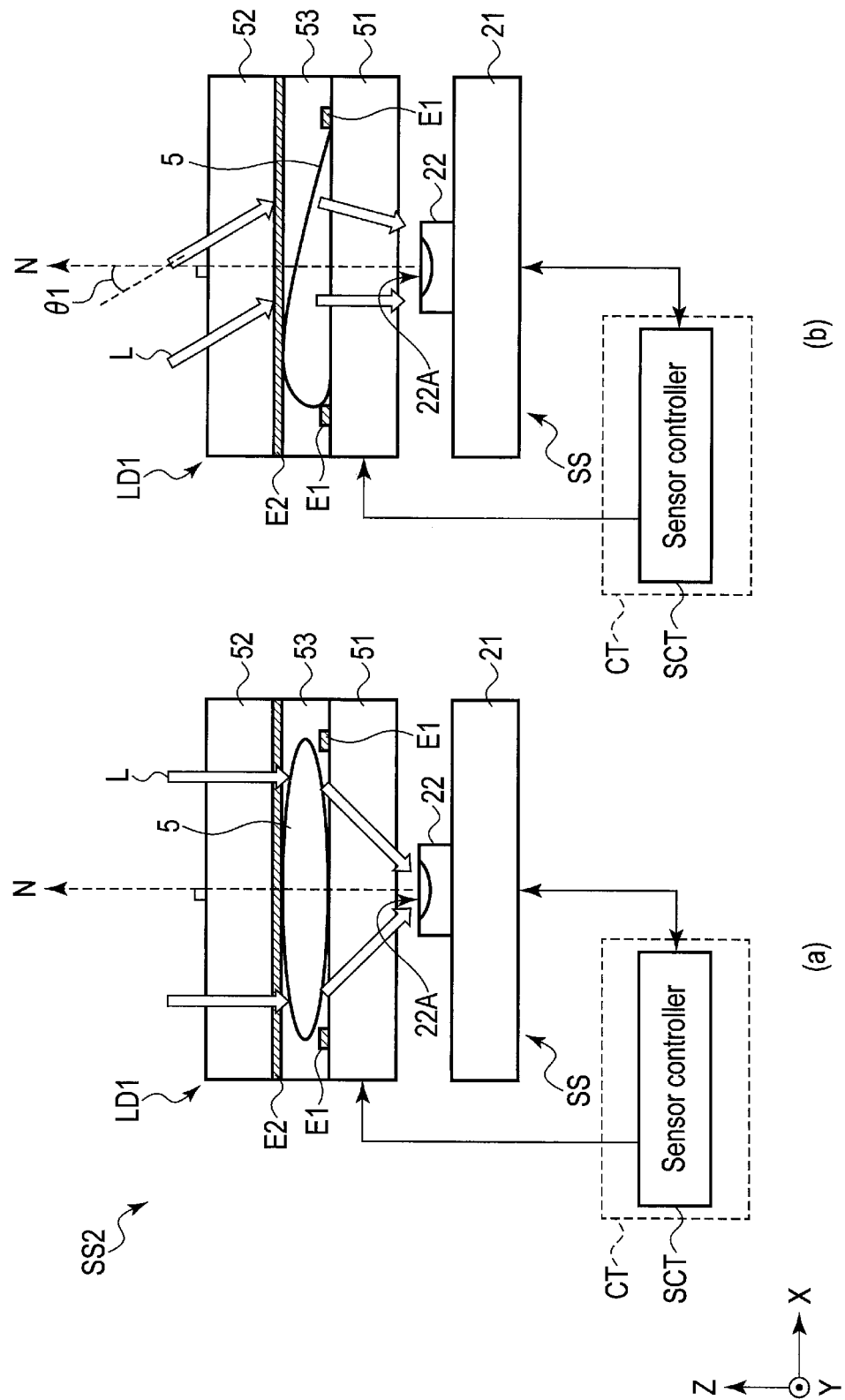
FIG. 15 is a diagram showing a structural example of a second sensor shown in FIG. 14.

FIG. 15 is a diagram showing a configuration example of the second sensor SS2 shown in FIG. 14. FIG. 15 illustrates a method of specifying the incident direction of light while controlling the lens 5 by such an arrangement that the liquid crystal element LD1 is located above the sensor SS.

The sensor SS comprises a substrate 21 and an optical sensor 22 mounted on the substrate 21. In the example illustrated, the sensor SS comprises a single optical sensor 22, but may comprise a plurality of optical sensors 22. The sensor-use liquid crystal element LD1 comprises a first substrate 51, a second substrate 52 and a liquid crystal layer 53, and its detailed structure corresponds to that of the liquid crystal element LD shown in FIG. 4. The first substrate 51 and the second substrate 52 are both light-transmissive. A light-receiving surface 22A of the optical sensor 22 is located directly under the first substrate 51. The light-receiving surface 22A may be spaced from the first substrate 51 or may be in contact with the first substrate 51. The lens 5 formed in the liquid crystal layer 53 opposes the optical sensor 22. The optical sensor 22 is located at a position where the incidence light on the liquid crystal element LD1 is converged by the lens 5. The optical sensor 22 outputs a signal according to the intensity of the light thus received. The sensor controller SCT measures the output from the optical sensor 22.

The case shown in FIG. 15, part (a) shows a state where the light L entering the liquid crystal element LD1 from a direction substantially parallel to the normal N is converged by the lens 5. The lens 5 illustrated here is a lens symmetrically shaped with respect to the normal N of the liquid crystal element LD1. The case shown in FIG. 15, part (b) shows a state where the light L entering the liquid crystal element LD1 from a direction inclined at an angle A1 with respect to the normal N is converged by the lens 5. The lens 5 illustrated here is a lens asymmetrically shaped with respect to the normal N of the liquid crystal element LD1.

The controller CT can determine the incident direction of the light L based on the shape of the lens 5 and the output from the optical sensor 22, measured by the sensor controller SCT.

FIG. 16 is a table listing examples of the reflectivity expressible by the display device DSP of the embodiment. Here, the amount of light entering indicates the intensity of the reflected light reaching the observer of the light having entered the liquid crystal element, and is variable by the shape of the lens.

When the amount of light entering the display panel PNL is 100%, the reflectivity at a gradation value 0 is 0%, that of a gradation value 1 is 33.3%, that of a gradation value 2 is 66.6%, and that of a gradation value 3 is 100%. When the amount of light entering the display panel PNL is 50%, the reflectivity at a gradation value 0 is 0%, that of a gradation value 1 is 16.6%, that of a gradation value 2 is 33.3%, and that of a gradation value 3 is 50%. When the amount of light entering the display panel PNL is 25%, the reflectivity at a gradation value 0 is 0%, that of a gradation value 1 is 8.3%, that of a gradation value 2 is 16.6%, and that of a gradation value 3 is 25%. Thus, substantially, eight gradations can be expressed by controlling the amount of light entering the display panel PNL. That is, the number of expressions on the low gradation side can be increased by weakening the specular reflection component by the liquid crystal element.

The examples illustrate the cases where the amount of light entering is 100%, 50% and 25%, but the amounts are only examples. The reflectivity can be controlled steplessly. In other words, it is possible by the shape of the lens to vary the intensity of the reflection light to the observer in a continuous manner.

Figure 17:
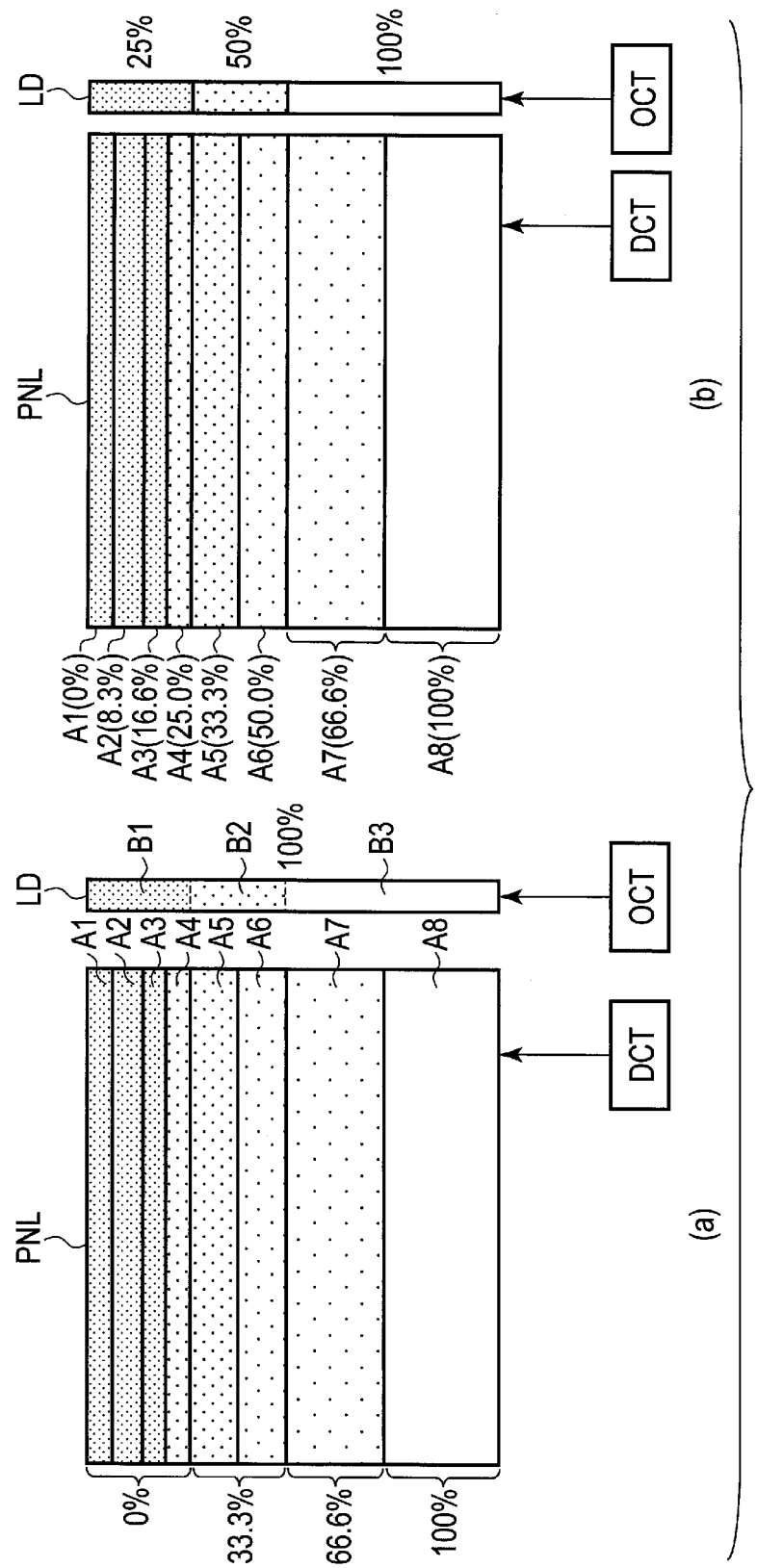
FIG. 17 is a diagram illustrating display of gradation by the display device of the embodiment.

FIG. 17 is a diagram illustrating gradation display by the display device DSP of the embodiment. FIG. 17 shows the case where the display panel PNL displays such gradation which becomes higher gradually from one end toward the other end. In the example illustrated, the display panel PNL includes areas A1 to A8, and the liquid crystal element LD includes areas B1 to B3. The area region B1 opposes the areas A1 to A4, the area B2 opposes the areas A5 and A6, and the area B3 opposes the areas A7 and A8. The areas A1 to A8 each comprises a plurality of pixel PXs in a matrix as shown in FIG. 2.

In an example shown in FIG. 17, part (a), the optical controller OCT forms the lens so that the amount of light entering from the liquid crystal element LD to the entire surface of the display panel PNL becomes 100%. The display controller DCT sets the first area A1 to the fourth area A4 of the display panels PNL to a gradation value 0, the fifth area A5 to the sixth area A6 to a gradation value 1, the seventh area A7 to a gradation value 2, and the eighth area A8 to a gradation value 3. In this case, the reflectivity of the first area A1 to the fourth area A4 is 0%, that of the fifth area A5 and the 6th area A6 is 33.3%, that of the seventh area A7 is 66.6%, and that of the eighth area A8 is 100%.

In an example shown in FIG. 17, part (b), the optical controller OCT forms the lens so that the amount of light entering the first area A1 to the fourth area A4 of the display panel PNL is 25%, that of the fifth area A5 and the 6th area A6 is 50%, that of the seventh area A7 and the eighth area A8 is 100%. The display controller DCT sets, of the first area A1 to the fourth area A4 which correspond to an amount of light entering of 25%, the first area A1 to a gradation value 0, the second area A2 to a gradation value 1, the third area A3 to a gradation value 2, and the fourth area A4 to a gradation value 3. The display controller DCT sets, of the fifth area A5 and the sixth area A6 which correspond to an amount of light entering of 50%, the fifth area A5 to a gradation value 2, and the sixth area A6 to a gradation value 3. The display controller DCT sets, of the seventh area A7 and the eighth area A8 which correspond to an amount of light entering of 100%, the seventh area A7 to a gradation value 2, and the eighth area A8 to a gradation value 3. In this case, the reflectivity of the first area A1 is 0%, that of the second area A2 is 8.3%, that of the third area A3 is 16.6%, that of the fourth area A4 is 25.0%, that of the fifth area A5 is 33.3%, that of the sixth area A6 is 50.0%, that of the seventh area A7 is 66.6%, and that of the eighth area A8 is 100%.

Thus, according to the display device DSP of this embodiment, the display panel PNL driven for gradation display and the liquid crystal element LD which controls the amount of light entering the display panel PNL are combined together, and with this configuration, it is possible to express a more number of gradations than that which can be driven by the display panel PNL solely. The number of gradation expressions particularly on the low gradation side can be increased, and therefore the display quality of black display can be improved and also the dynamic range on the low gradation side can be expanded.

The adjustment of the gradation by the liquid crystal element LD, described above, may be performed by distinguishing an image for each pixel or for each area containing a plurality of pixels.

As described above, according to the embodiment, a display device with improved display quality can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a display panel comprising a pixel electrode which is a reflective layer formed from a reflective metal material, and a common electrode which is formed from a transparent conductive material;
a liquid crystal element opposing the display panel;
a controller that controls the liquid crystal element; and
a polarizer disposed between the display panel and the liquid crystal element; and
a first sensor which detects a position of an observer, wherein
the liquid crystal element comprises a first substrate, a second substrate, a liquid crystal layer held between the first substrate and the second substrate, a first control electrode, a second control electrode, a third control electrode, and a fourth control electrode,
the controller applies a first voltage for forming a first lens of a first shape in the liquid crystal layer, to the first control electrode and the second control electrode, and applies a second voltage for forming a second lens of a second shape at a position different from that of the first lens in the liquid crystal layer, to the third control electrode and the fourth control electrode,
the first shape is different from the second shape,
the polarizer comprises a transmission axis extending in a direction in which the first control electrode extends, and
the controller controls the liquid crystal element based on an output of the first sensor and changes the first shape and the second shape based on the output of the first sensor.

2. The device of claim 1, wherein
an amount of light passing through the first lens of the first shape and an amount of light passing through the second lens of the second shape are equal to each other at a first position.

3. The device of claim 1, wherein
the controller applies a third voltage for forming a first lens of a third shape in the liquid crystal layer, to the first control electrode and the second control electrode, a fourth voltage for forming a second lens of a fourth shape at a position different from that of the first lens in the liquid crystal layer, to the third control electrode and the fourth control electrode, and
the third shape and the fourth shape are different from each other.

4. The device of claim 3, wherein
an amount of light passing through the first lens of the third shape and an amount of light passing through the second lens of the fourth shape are equal to each other at a second position.

5. The device of claim 1, further comprising:
a second sensor which detects an intensity of light, wherein
the controller controls the liquid crystal element based on the intensity of the light detected by the second sensor.

6. The device of claim 1, wherein
the first substrate includes the first control electrode and the third control electrode, and the second substrate includes the second control electrode and the fourth control electrode.

7. The device of claim 6, wherein
the first control electrode opposes the second control electrode via the liquid crystal layer, and the third control electrode opposes the fourth control electrode via the liquid crystal layer.

8. The devices of claim 1, wherein
a plurality of first control electrodes are arranged along a first direction at intervals, and extend along a second direction which crosses the first direction.

9. The device of claim 8, wherein
a width of the first control electrode along the first direction is less than or equal to an interval between an adjacent pair of the first control electrodes along the first direction.

10. The device of claim 8, wherein
the liquid crystal element comprises a sealant which adheres the first substrate and the second substrate together,
the first substrate comprises a power supply line arranged in a position which overlaps the sealant, and includes the first control electrode,
the second substrate includes the second control electrode extending to a position which overlaps the sealant,
the sealant comprises a conductive material interposed between the power supply line and the second control electrode, and
the power supply line and the second control electrode are electrically connected to each other by the conductive material.

11. The device of claim 10, wherein
the second control electrode is a single plate electrode opposing the plurality of first control electrodes.

* * * * *